United States Patent
Lee et al.

(10) Patent No.: US 10,218,344 B1
(45) Date of Patent: Feb. 26, 2019

(54) VOLTAGE CONVERSION CIRCUIT AND CONTROL CIRCUIT THEREOF

(71) Applicant: Excelliance MOS Corporation, Hsinchu County (TW)

(72) Inventors: Ching-Tsan Lee, Hsinchu County (TW); Pei-Ting Yang, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 16/121,646

(22) Filed: Sep. 5, 2018

(30) Foreign Application Priority Data

Jun. 28, 2018 (TW) .............................. 107122374 A

(51) Int. Cl.
*H03K 17/042* (2006.01)
*H03K 17/082* (2006.01)

(52) U.S. Cl.
CPC ......... *H03K 17/042* (2013.01); *H03K 17/082* (2013.01); *H03K 2217/0081* (2013.01)

(58) Field of Classification Search
None
See application file for complete search history.

(56) References Cited

U.S. PATENT DOCUMENTS

| | | | |
|---|---|---|---|
| 6,882,513 B2 | 4/2005 | Laraia | |
| 8,670,219 B2 | 3/2014 | Disney | |
| 2006/0012451 A1* | 1/2006 | De Cremoux | G05F 1/46 333/216 |
| 2012/0206110 A1* | 8/2012 | Nishida | H02J 7/0034 320/163 |
| 2016/0373103 A1* | 12/2016 | Miyamae | H03K 17/04 |
| 2017/0271883 A1* | 9/2017 | Cai | H02J 4/00 |

FOREIGN PATENT DOCUMENTS

| | | |
|---|---|---|
| CN | 102468646 | 5/2012 |
| TW | 201308814 | 2/2013 |

* cited by examiner

*Primary Examiner* — Cassandra F Cox
(74) *Attorney, Agent, or Firm* — JCIPRNET

(57) ABSTRACT

A voltage conversion circuit and a control circuit thereof are provided. The control circuit includes a voltage selection circuit, a buffer circuit, and a pull-down switch. The voltage selection circuit receives an input voltage and an output voltage, and selects a smaller voltage value as a selected voltage from the input voltage and the output voltage. The buffer circuit receives the selected voltage, and provides the selected voltage as a reference voltage. A control end of the pull-down switch receives an enable signal, so that the pull-down switch is switched on or switched off based on the enable signal. The pull-down switch is switched on based on the enable signal, to pull down a voltage at a control end of a driver switch to the reference voltage and switch off the driver switch.

12 Claims, 4 Drawing Sheets

VOLTAGE CONVERSION CIRCUIT AND CONTROL CIRCUIT THEREOF

CROSS-REFERENCE TO RELATED APPLICATION

This application claims the priority benefits of Taiwan application serial no. 107122374, filed on Jun. 28, 2018. The entirety of the above-mentioned patent application is hereby incorporated by reference herein and made a part of this specification.

BACKGROUND OF THE INVENTION

Field of the Invention

The present invention relates to a voltage conversion circuit and a control circuit thereof, and in particular, to a voltage conversion circuit capable of quickly re-switched on a driver switch and a control circuit thereof.

Description of Related Art

In the conventional technical field, a power conversion circuit provides a driver switch, and supplies an output voltage by switching on the driver switch. In addition, in a condition in which an input voltage is received, a circuit protection mechanism needs to be enabled, for example, in state of overcurrent protection, overvoltage protection, and reverse voltage protection is received, a conventional power conversion circuit may generate a control signal to pull down a voltage at a control end of the driver switch to a grounding voltage, to switch off the driver switch.

However, when the circuit protection mechanism is released, the driver switch is re-switched on. In this case, the voltage at the control end of the driver switch is gradually increased. A load capacitor at an output end and gate and source capacitors of the driver switch need to be recharged, which takes a relatively long time. If the voltage at the control end of the driver switch is increased from zero, the switch-on speed is excessively slow, which can easily cause problem of power failure in the output voltage. Therefore, to increase the speed of re-switching on the driver switch at the end the circuit protection mechanism becomes an important project.

SUMMARY OF THE INVENTION

The present invention provides a voltage conversion circuit and a control circuit thereof, to achieve a function of quickly re-switching on a driver switch.

A control circuit in the present invention is configured to control a driver switch. Two ends of the driver switch respectively receive an input voltage and an output voltage. The control circuit includes a voltage selection circuit, a buffer circuit, and a pull-down switch. The voltage selection circuit receives the input voltage and the output voltage, and selects a smaller voltage value as a selected voltage from the input voltage and the output voltage. The buffer circuit is coupled to the voltage selection circuit, receives the selected voltage, and provides the selected voltage as a reference voltage. The pull-down switch is connected in series between a control end of the driver switch and the reference voltage, and a control end of the pull-down switch receives an enable signal, so that the pull-down switch is switched on or switched off based on the enable signal. The pull-down switch is switched on based on the enable signal, to pull down a voltage at the control end of the driver switch to the reference voltage and switch off the driver switch.

Based on the foregoing, the present invention provides the control circuit, and the smaller voltage value is selected as the selected voltage from the input voltage and the output voltage, to provide the selected voltage as the reference voltage. The pull-down switch is switched on based on the enable signal, to pull down the voltage at the control end of the driver switch to the reference voltage and switch off the driver switch. In this way, after a circuit protection mechanism is released, and when the driver switch needs to be re-switched on, the voltage value at the control end of the driver switch is increased from a voltage value of the reference voltage, so that the time required by recovering the voltage at the control end of the driver switch can be reduced, to quickly re-switch on the driver switch.

In order to make the aforementioned objectives and advantages of the present invention more comprehensible, embodiments accompanied with figures are described in detail below.

DESCRIPTION OF THE EMBODIMENTS

Figure 1:
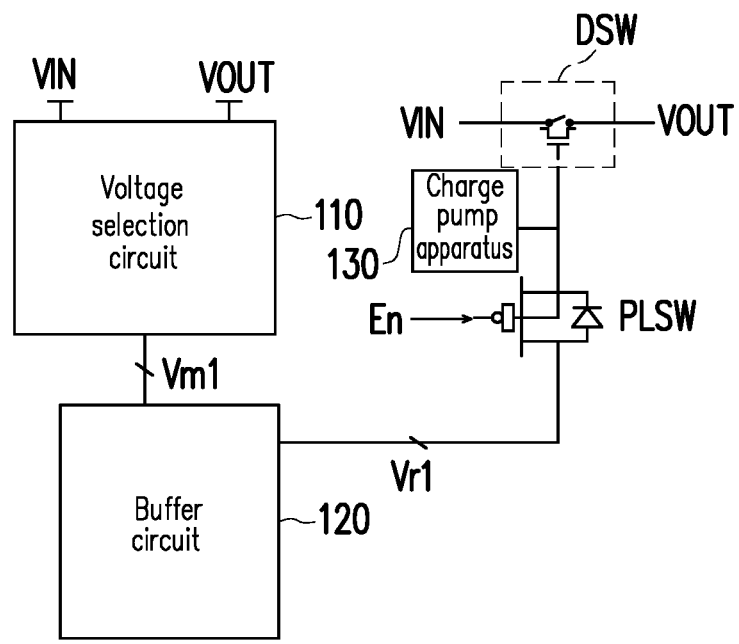
FIG. 1 is a schematic diagram of a control circuit according to an embodiment of the present invention.

Referring to FIG. 1, is a schematic diagram of a control circuit according to an embodiment of the present invention. The control circuit 100 may be configured to control a driver switch DSW, and two ends of the driver switch DSW respectively receive an input voltage VIN and an output voltage VOUT. The control circuit 100 includes a voltage selection circuit 110, a buffer circuit 120, a charge pump apparatus 130, and a pull-down switch PLSW. The voltage selection circuit 110 receives the input voltage VIN and the output voltage VOUT, and selects a smaller voltage value as a selected voltage Vm1 from the input voltage VIN and the output voltage VOUT. The buffer circuit 120 is coupled to the voltage selection circuit 110, receives the selected voltage Vm1, and provides the selected voltage Vm1 as a reference voltage Vr1. The charge pump apparatus 130 is coupled to a control end of the driver switch DSW and configured to increase a voltage value at the control end of the driver switch DSW. The pull-down switch PLSW is connected in series between the control end of the driver switch DSW and the reference voltage Vr1, and a control end of the pull-down switch PLSW receives an enable signal En, so that the pull-down switch PLSW is switched on or switched off based on the enable signal En. The pull-down switch PLSW is switched on based on the enable signal En, to pull down a voltage at the control end of the driver switch DSW to the reference voltage Vr1 and switch off the driver switch DSW.

Specifically, in the present embodiment, after receiving the input voltage YIN and the output voltage VOUT, the voltage selection circuit 110 in the control circuit 100 performs selection based on a voltage value of the input voltage VIN and a voltage value of the output voltage VOUT. For example, when the voltage value of the input voltage VIN is greater than the voltage value of the output voltage VOUT, the voltage selection circuit 110 selects the output voltage VOUT whose voltage value is smaller as the selected voltage Vm1, and transmits the selected voltage Vm1 to the buffer circuit 120. Oppositely, if the voltage value of the output voltage VOUT is greater than the voltage value of the input voltage VIN, the voltage selection circuit 110 selects the input voltage VIN whose voltage value is smaller as the selected voltage Vm1.

After receiving the selected voltage Vm1, the buffer circuit 120 generates the reference voltage Vr1 based on the selected voltage Vm1, and provides the reference voltage Vr1 to a second end of the pull-down switch PLSW. A voltage value of the reference voltage Vr1 is essentially equal to a voltage value of the selected voltage Vm1, and the voltage value of the reference voltage Vr1 is greater than a voltage value of a grounding voltage. In addition, the control end of the pull-down switch PLSW receives the enable signal En, and the pull-down switch PLSW is switched on or switched off based on the enable signal En.

In addition, the charge pump apparatus 130 is coupled to the control end of the driver switch DSW. The charge pump apparatus 130 is configured to increase the voltage value at the control end of the driver switch DSW under normal action of the circuit (that is, not in states of overcurrent protection, overvoltage protection and reverse voltage protection), to switch on the driver switch DSW.

Based on the foregoing, for the driver switch DSW in the control circuit 100, when a protection mechanism is enabled, the pull-down switch PLSW is switched on based on the enable signal En for enabling a voltage level, so as to pull down the voltage at the control end of the driver switch DSW to the reference voltage Vr1 and switch off the driver switch DSW. The voltage value of the reference voltage Vr1 is greater than the voltage value of the grounding voltage. Therefore, after the circuit protection mechanism is released, and when the driver switch is re-switched on, the voltage value at the control end of the driver switch DSW starts to increase from the voltage value of the reference voltage Vr1, to reduce the time required by recovering the voltage at the control end of the driver switch DSW, thereby quickly re-switching on the driver switch DSW.

Figure 2:
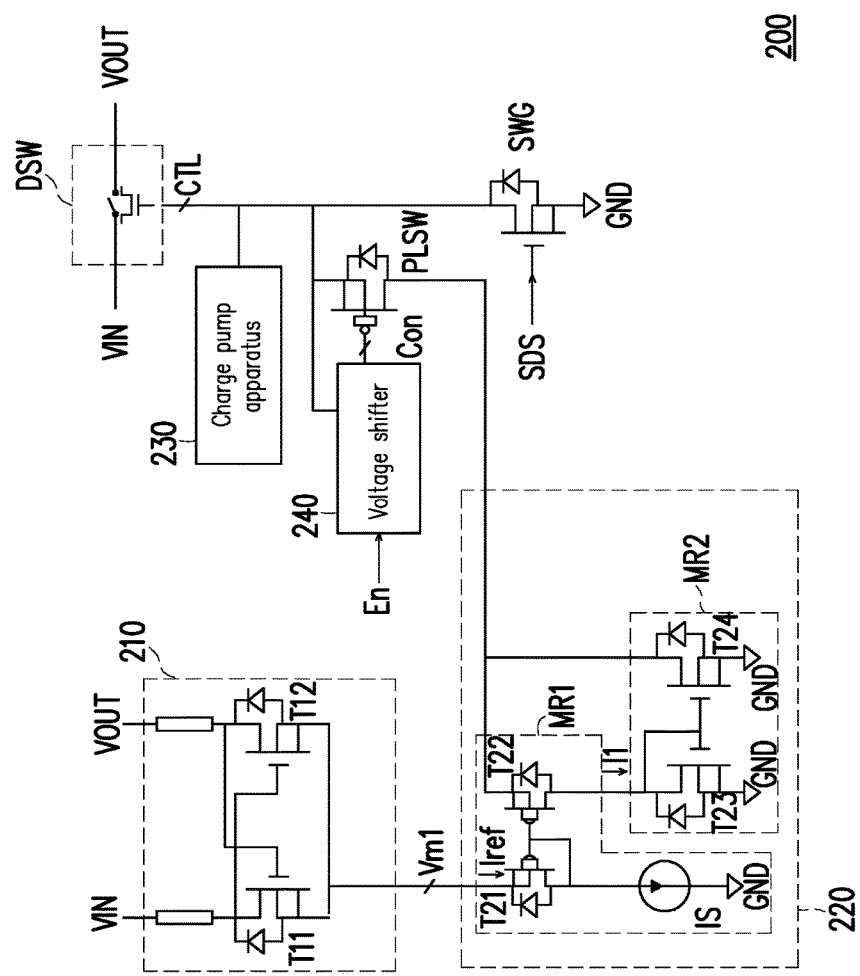
FIG. 2 is a schematic diagram of a control circuit according to another embodiment of the present invention.

Referring to FIG. 2, is a schematic diagram of a control circuit according to another embodiment of the present invention. In the present embodiment, the control circuit 200 is configured to control on and off actions on a driver switch DSW. The control circuit 200 includes a voltage selection circuit 210, a buffer circuit 220, a charge pump apparatus 230, a voltage shifter 240, a pull-down switch PLSW, and a grounding switch SWG. The voltage selection circuit 210 includes a transistor T11 and a transistor T12. A first end of the transistor T11 receives an input voltage VIN, a control end receives an output voltage VOUT, and a second end of the transistor T11 is coupled to the buffer circuit 220. A first end of the transistor T12 receives an output voltage VOUT, a control end receives an input voltage VIN, and a second end of the transistor T12 is coupled to the second end of the transistor T11.

In terms of circuit action, the first end of the transistor T11 and the first end of the transistor T12 in the voltage selection circuit 210 respectively receive the input voltage VIN and the output voltage VOUT, and the voltage selection circuit 210 performs selection based on a voltage value of the input voltage VIN and a voltage value of the output voltage VOUT. For example, when the voltage value of the input voltage VIN is greater than the voltage value of the output voltage VOUT, the transistor T12 is switched on based on the input voltage VIN, and outputs the output voltage VOUT as a selected voltage Vm1 to the buffer circuit 220. In this case, the transistor T11 is switched off. Oppositely, when the voltage value of the input voltage VIN is less than the voltage value of the output voltage VOUT, the transistor T11 is switched on based on the output voltage VOUT, and outputs the input voltage VIN as a selected voltage Vm1 to the buffer circuit 220. In this case, the transistor T12 is switched off.

The buffer circuit 220 includes a first current mirror circuit MR1 and a second current mirror circuit MR2. The first current mirror circuit MR1 receives the selected voltage Vm1 as an operating voltage, where a first end of the first current mirror circuit MR1 receives a reference current Iref; and mirrors the reference current Iref to generate a first current I1 at a second end of the first current mirror circuit MR1. The second current mirror circuit MR2 is coupled to the first current mirror circuit MR1, and receives and mirrors the first current I1, so that a second end of the pull-down switch PLSW obtains a second current I2. A voltage value at the second end of the pull-down switch PLSW is pulled down to be equal to a voltage value of a reference voltage Vr1 based on the second current I2.

In terms of details, in the present embodiment, the first current mirror circuit MR1 includes transistors T21 and T22 and a current source IS. A first end of the transistor T21 is coupled to the voltage selection circuit 210, and a control end and a second end of the transistor T21 are coupled to each other. A first end of the transistor T22 is coupled to the second end of the pull-down switch PLSW, a control end of the transistor T22 is coupled to the control end of the transistor T21, and a second end outputs the first current I1. The current source IS is coupled between a grounding voltage GND and the second end of the transistor T21, and is configured to provide the reference current Iref.

In addition, the second current mirror circuit MR2 includes transistors T23 and T24. A first end and a control end of the transistor T23 are coupled to the second end of the transistor T22, and a second end of the transistor T23 receives the grounding voltage GND. A first end of the transistor T24 is coupled to the second end of the pull-down switch PLSW, a control end of the transistor T24 is coupled to the control end of the transistor T23, and the second end receives the grounding voltage GND.

When the selected voltage Vm1 is provided to the first end of the transistor T21, the transistor T21 is correspondingly switched on, and voltages at the control end and the second end of the transistor T21 are equal to a value obtained by subtracting a critical voltage (Vth) of the transistor T21 from the selected voltage Vm1. The control end of the transistor T22 receives a voltage (=Vm1−Vth) the same as that at the control end of the transistor T21, and correspondingly generates the first current I1. The first current I1 flows through the transistors T22 and T23, and makes a voltage at the first end of the transistor T22 essentially equal to a voltage value of the selected voltage Vm1. The voltage at the first end of the transistor T22 is provided as the reference voltage Vr1 to the second end of the pull-down switch PLSW.

It should be noted that in the present embodiment, a width-length ratio of a current channel of the transistor T24 in the second current mirror circuit MR2 may be increased to be greater than (for example, being N times, where N is a real number greater than 1) a width-length ratio of a current channel of the transistor T23 in the second current mirror circuit MR2, to increase the second current I2 obtained from the second end of the pull-down switch PLSW. The voltage value at the second end of the pull-down switch PLSW is pulled down to be equal to the voltage value of the reference voltage Vr1 based on the second current I2. Therefore, a relatively large second current I2 can reduce the time of pulling down a voltage at a control end of the driver switch DSW to the reference voltage Vr1.

In addition, in the present embodiment, a conductivity type of the transistors T21 and T22 is different from that of the transistors T23 and T24. FIG. 2 shows that the first current mirror circuit MR1 and the second current mirror circuit MR2 are respectively constructed by using two P-doped transistors T21 and T22 and two N-doped transistors T23 and T24.

In addition, the charge pump apparatus 230 is coupled to the control end of the driver switch DSW. The charge pump apparatus 230 is configured to increase a voltage value at the control end of the driver switch DSW under normal action, to switch on the driver switch DSW. The voltage shifter 240 is coupled to the control end of the pull-down switch PLSW and the control end of the driver switch DSW, receives a control signal CTL at the control end of the driver switch DSW as an operating voltage, and shifts an enable signal En to generate a pull-down switch signal Con to the control end of the pull-down switch PLSW, to control an on or off state of the pull-down switch PLSW. When shifting the enable signal En to enable a voltage level, the voltage shifter 240 may pull up the voltage level of shifting the enable signal En to generate the pull-down switch signal Con, and switches off the pull-down switch PLSW based on the pull-down switch signal Con. A first end of the grounding switch SWG is coupled to the control end of the driver switch DSW, a control end of the grounding switch SWG receives a shut-down signal SDS, and a second end of the grounding switch SWG receives the grounding voltage GND. The grounding switch SWG is switched on based on the shutdown signal SDS, to pull down the voltage at the control end of the driver switch DSW to the grounding voltage GND.

Figure 3:
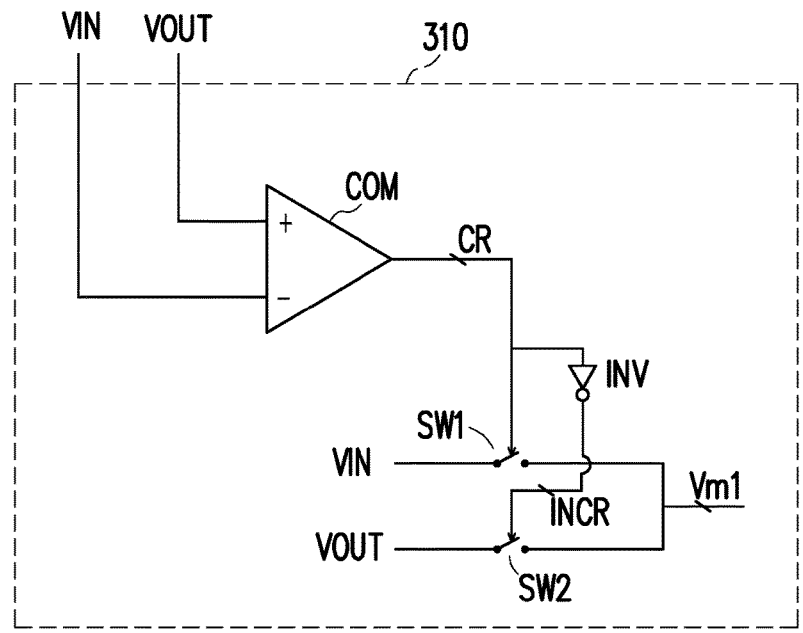
FIG. 3 is a schematic diagram of another implementation of a voltage selection circuit according to an embodiment of the present invention.

Referring to FIG. 3, is a schematic diagram of another implementation of a voltage selection circuit according to an embodiment of the present invention. In the present embodiment, the voltage selection circuit 310 includes a comparator COM, a first switch SW1, a second switch SW2, and an inverter INV. The comparator COM includes a positive input end, a negative input end, and an output end. The positive input end of the comparator COM receives an output voltage VOUT, and the negative input end of the comparator COM receives an input voltage VIN. The comparator COM may compare a voltage value of the output voltage VOUT with a voltage value of the input voltage VIN, and generate a comparison result CR at the output end of the comparator COM. A control end of the first switch SW1 is coupled to the output end of the comparator COM, a first end of the first switch SW1 receives the input voltage VIN, and a second end of the first switch SW1 is coupled to a buffer circuit. The first switch SW1 is switched on or switched off based on the comparison result CR. A control end of the second switch SW2 receives an inverse comparison result INCR, a first end of the second switch SW2 receives the output voltage VOUT, and a second end of the second switch SW2 is coupled to the second end of the first switch SW1. The second switch SW2 is switched on or switched off based on the inverse comparison result INCR. An input end and an output end of the inverter NV are respectively coupled to the output end of the comparator COM and the control end of the second switch SW2 to receive the comparison result CR and generate the inverse comparison result INCR.

In terms of detailed circuit action, when the voltage value of the input voltage VIN is greater than the voltage value of the output voltage VOUT, the comparator COM may generate the comparison result CR for a first logic level (for example, a low logic level). The inverter INV receives the comparison result CR for the low logic level, and generates the inverse comparison result INCR for a second logic level (for example, a high logic level). In this way, the second switch SW2 may be switched on, the first switch SW1 is switched off, and the output voltage VOUT is used as a selected voltage Vm1 to be transmitted to the buffer circuit. Oppositely, when the voltage value of the output voltage VOUT is greater than the voltage value of the input voltage VIN, the second switch SW2 may be switched off, the first switch SW1 is switched on, and the input voltage VIN is used as a selected voltage Vm1 to be transmitted to the buffer circuit.

Figure 4:
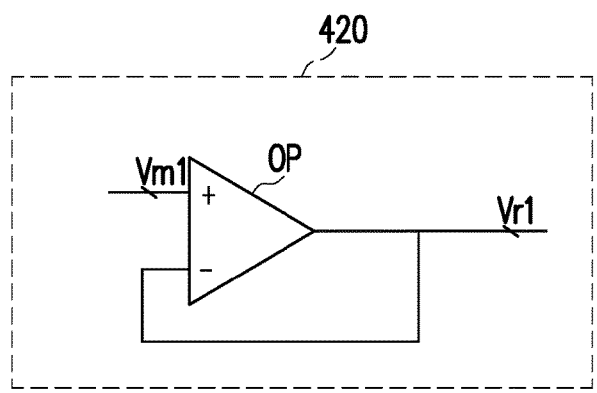
FIG. 4 is a schematic diagram of another implementation of a buffer circuit according to an embodiment of the present invention.

Referring to FIG. 4, is a schematic diagram of another implementation of a buffer circuit according to an embodiment of the present invention. In the present embodiment, the buffer circuit 420 in a control circuit includes an operational amplifier OP. The operational amplifier OP includes a positive input end, a negative input end, and an output end. The positive input end of the operational amplifier OP is coupled to a voltage selection circuit, the negative input end and the output end of operational amplifier OP are coupled to each other. The positive input end of the operational amplifier OP receives a selected voltage Vm1, and provides the selected voltage Vm1 as a reference voltage Vr1 to the output end of the operational amplifier OP.

It should be noted that the buffer circuit 420 in the present embodiment may be an operational amplifier OP coupled into a form of a voltage follower. The voltage follower may be a unit gain amplification circuit, and the voltage follower is configured to provide, to a second end of a pull-down switch, a reference voltage Vr1 equal to the selected voltage Vm1.

Figure 5:
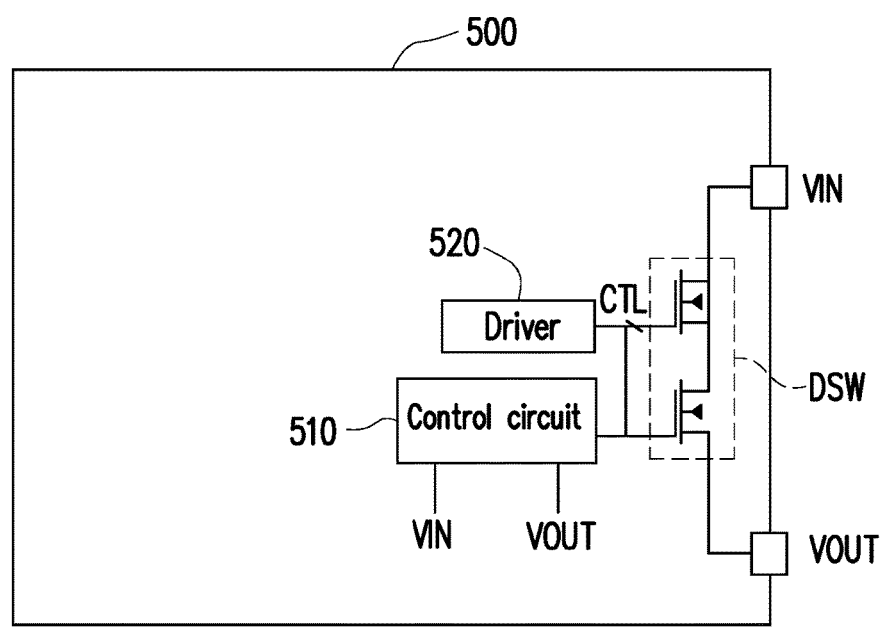
FIG. 5 is a schematic diagram of a voltage conversion circuit according to an embodiment of the present invention.

Referring to FIG. 5, is a schematic diagram of a voltage conversion circuit according to an embodiment of the present invention. The voltage conversion circuit 500 includes a driver switch DSW, a control circuit 510, and a driver 520. The voltage conversion circuit 500 has a plurality of pins to respectively receive an input voltage VIN and an output voltage VOUT.

The driver 520 is configured to generate a control signal CTL to control on and off states of the driver switch DSW. The control circuit 510 is coupled to an output end of the driver 520. The control circuit 510 receives the input voltage VIN and the output voltage VOUT, selects a smaller voltage value as a selected voltage from a voltage value of the input voltage VIN and a voltage value of the output voltage VOUT, and provides the selected voltage as a reference voltage, so that a pull-down switch in the control circuit 510 pulls down a voltage at a control end of the driver switch DSW to the reference voltage and switches off the driver switch DSW.

In terms of implementation details of the control circuit 510, detailed descriptions have been provided in the foregoing plurality of implementations, and the descriptions thereof are omitted herein.

Based on the foregoing, in the voltage conversion circuit in the present invention, the smaller value is selected as the selected voltage from the voltage value of the input voltage and the voltage value of the output voltage at two ends of the driver switch, and the selected voltage is provided as the reference voltage, so that when switched on based on the enable signal, the pull-down switch pulls down the voltage at the control end of the driver switch to the reference voltage and switches off the driver switch. In this way, after the circuit protection mechanism is released, the voltage value at the control end of the driver switch can be increased from the voltage value of the reference voltage, so that the time required by recovering the voltage at the control end of the driver switch is reduced, and the driver switch is quickly re-switched on.

Although the present invention is disclosed above by using the embodiments, the embodiments are not intended to limit the present invention. A person of ordinary skill in the art can make some variations and polishes without departing from the spirit and scope of the present invention. Therefore, the protection scope of the present invention should be subject to the scope of the following claims.

What is claimed is:

1. A control circuit, configured to control a driver switch, wherein two ends of the driver switch respectively receive an input voltage and an output voltage, and the control circuit comprises:
   a voltage selection circuit, configured to receive the input voltage and the output voltage, and select a smaller voltage value as a selected voltage from the input voltage and the output voltage;
   a buffer circuit, coupled to the voltage selection circuit, and configured to receive the selected voltage and provide the selected voltage as a reference voltage; and
   a pull-down switch, wherein the pull-down switch is connected in series between a control end of the driver switch and the reference voltage, and a control end of the pull-down switch receives an enable signal, so that the pull-down switch is switched on or switched off based on the enable signal, wherein
   the pull-down switch is switched on based on the enable signal, to pull down a voltage at the control end of the driver switch to the reference voltage and switch off the driver switch.

2. The control circuit according to claim 1, wherein a voltage value of the reference voltage is greater than a voltage value of a grounding voltage.

3. The control circuit according to claim 1, wherein the voltage selection circuit comprises:
   a first transistor, wherein a first end of the first transistor receives the input voltage, a control end of the first transistor receives the output voltage, and a second end of the first transistor is coupled to the buffer circuit; and
   a second transistor, wherein a first end of the second transistor receives the output voltage, a control end of the second transistor receives the input voltage, and a second end of the second transistor is coupled to the second end of the first transistor.

4. The control circuit according to claim 3, wherein when a voltage value of the input voltage is greater than a voltage value of the output voltage, the second transistor is switched on based on the input voltage and outputs the output voltage as the selected voltage to the buffer circuit.

5. The control circuit according to claim 3, wherein when a voltage value of the output voltage is greater than a voltage value of the input voltage, the first transistor is switched on based on the output voltage and outputs the input voltage as the selected voltage to the buffer circuit.

6. The control circuit according to claim 1, wherein the voltage selection circuit comprises:
   a comparator, comprising a positive input end, a negative input end, and an output end, wherein the positive input end of the comparator receives the output voltage, the negative input end of the comparator receives the input voltage, and the comparator compares a voltage value of the output voltage with a voltage value of the input voltage to generate a comparison result at the output end of the comparator;
   a first switch, wherein a control end of the first switch is coupled to the output end of the comparator, a first end of the first switch receives the input voltage, a second end of the first switch is coupled to the buffer circuit, and the first switch is switched on or switched off based on the comparison result;
   a second switch, wherein a control end of the second switch receives an inverse comparison result, a first end of the second switch receives the output voltage, a second end of the second switch is coupled to the second end of the first switch, and the second switch is switched on or switched off based on the inverse comparison result; and
   an inverter, wherein an input end and an output end of the inverter are respectively coupled to the output end of the comparator and the control end of the second switch to receive the comparison result and generate the inverse comparison result.

7. The control circuit according to claim 1, wherein the buffer circuit comprises:
   a first current mirror circuit, configured to: receive the selected voltage as an operating voltage, wherein a first end of the first current mirror circuit receives a reference current; and mirror the reference current to generate a first current at the second end of the first current mirror circuit; and
   a second current mirror circuit, coupled to the first current mirror circuit and configured to receive and mirror the first current so that a second end of the pull-down switch obtains a second current, wherein
   a voltage value at the second end of the pull-down switch is pulled down to be equal to a voltage value of the reference voltage based on the second current.

8. The control circuit according to claim 7, wherein the first current mirror circuit comprises:
   a first transistor, wherein a first end of the first transistor is coupled to the voltage selection circuit, and a control end and a second end of the first transistor are coupled to each other;
   a second transistor, wherein a first end of the second transistor is coupled to the second end of the pull-down switch, a control end of the second transistor is coupled to the control end of the first transistor, and a second end of the second transistor outputs the first current; and
   a current source, coupled between a grounding voltage and the second end of the first transistor to provide the reference current.

9. The control circuit according to claim 8, wherein the second current mirror circuit comprises:
   a third transistor, wherein a first end and a control end of the third transistor are coupled to the second end of the second transistor, and a second end of the third transistor receives the grounding voltage; and
   a fourth transistor, wherein a first end of the fourth transistor is coupled to the second end of the pull-down switch, a control end of the fourth transistor is coupled to the control end of the third transistor, and a second end of the fourth transistor receives the grounding voltage, wherein a width-length ratio of the fourth transistor is N times a width-length ratio of the third transistor, wherein N is a real number not less than 1.

10. The control circuit according to claim 1, wherein the buffer circuit comprises:

an operational amplifier, comprising a positive input end, a negative input end, and an output end, wherein the positive input end of the operational amplifier is coupled to the voltage selection circuit, the negative input end and the output end of the operational amplifier are coupled to each other, and the positive input end of the operational amplifier receives the selected voltage and provides the selected voltage as the reference voltage to the output end of the operational amplifier.

11. The control circuit according to claim 1, further comprising:

a charge pump apparatus, coupled to the control end of the driver switch and configured to increase a voltage value at the control end of the driver switch;

a voltage shifter, coupled to the control end of the pull-down switch and the control end of the driver switch, and configured to receive a control signal as an operating voltage and shift the enable signal to generate a pull-down switch signal to control an on or off state of the pull-down switch; and a grounding switch, wherein a first end of the grounding switch is coupled to the control end of the driver switch, a control end of the grounding switch receives a shutdown signal, a second end of the grounding switch receives a grounding voltage, and the grounding switch is switched on based on the shutdown signal, to pull down a voltage at the control end of the driver switch to the grounding voltage.

12. A voltage conversion circuit, comprising:

a driver switch; and the control circuit according to claim 1, wherein the control circuit is coupled to the driver switch and provides the reference voltage, to pull down the voltage at the control end of the driver switch to the reference voltage and switch off the driver switch.

* * * * *